United States Patent [19]

Fujibayashi

[11] 4,450,413

[45] May 22, 1984

[54] AUTOMATIC SIGNAL LEVEL CONTROL DEVICE

[75] Inventor: Kenji Fujibayashi, Tokyo, Japan

[73] Assignee: Olympus Optical Co., Ltd., Tokyo, Japan

[21] Appl. No.: 352,644

[22] Filed: Feb. 26, 1982

[30] Foreign Application Priority Data

Mar. 10, 1981 [JP] Japan .................................. 56-34295
Mar. 10, 1981 [JP] Japan .................................. 56-34296

[51] Int. Cl.³ ............................................... H03G 3/30
[52] U.S. Cl. ...................................... 330/279; 330/86; 330/282; 330/284
[58] Field of Search ............... 330/279, 282, 283, 284, 330/86 (U.S. only), 144 (U.S. only), 145 (U.S. only); 455/249, 253

[56] References Cited

U.S. PATENT DOCUMENTS 3,725,800  4/1973  Papay .................................... 330/29

OTHER PUBLICATIONS

Caringella Electronics, Inc. ad for Audio Compressor Model ACA-1.

Primary Examiner—James B. Mullins
Assistant Examiner—Steven J. Mottola
Attorney, Agent, or Firm—Frishauf, Holtz, Goodman & Woodward

[57] ABSTRACT

An automatic signal level control device has a variable impedance element whose impedance varies with the level of a control signal; a variable gain circuit whose gain varies with the impedance of the variable impedance element; and a detector for generating the control signal upon receipt of an output signal from the variable gain circuit. The detector includes a transistor whose base is supplied with a first signal corresponding to the output signal from the variable gain circuit and from whose emitter there is drawn out a second signal having a potential corresponding to that of the first signal; a feedback element which is connected between the base and emitter of the transistor; and a capacitor which is connected between the emitter of the transistor and a circuit having substantially no AC potential to store a charge corresponding to the second signal. A feedback signal corresponding to the charged potential of the capacitor is supplied to the base of the transistor through the feedback element, and the second signal is used as the control signal.

22 Claims, 10 Drawing Figures

F I G. 3A
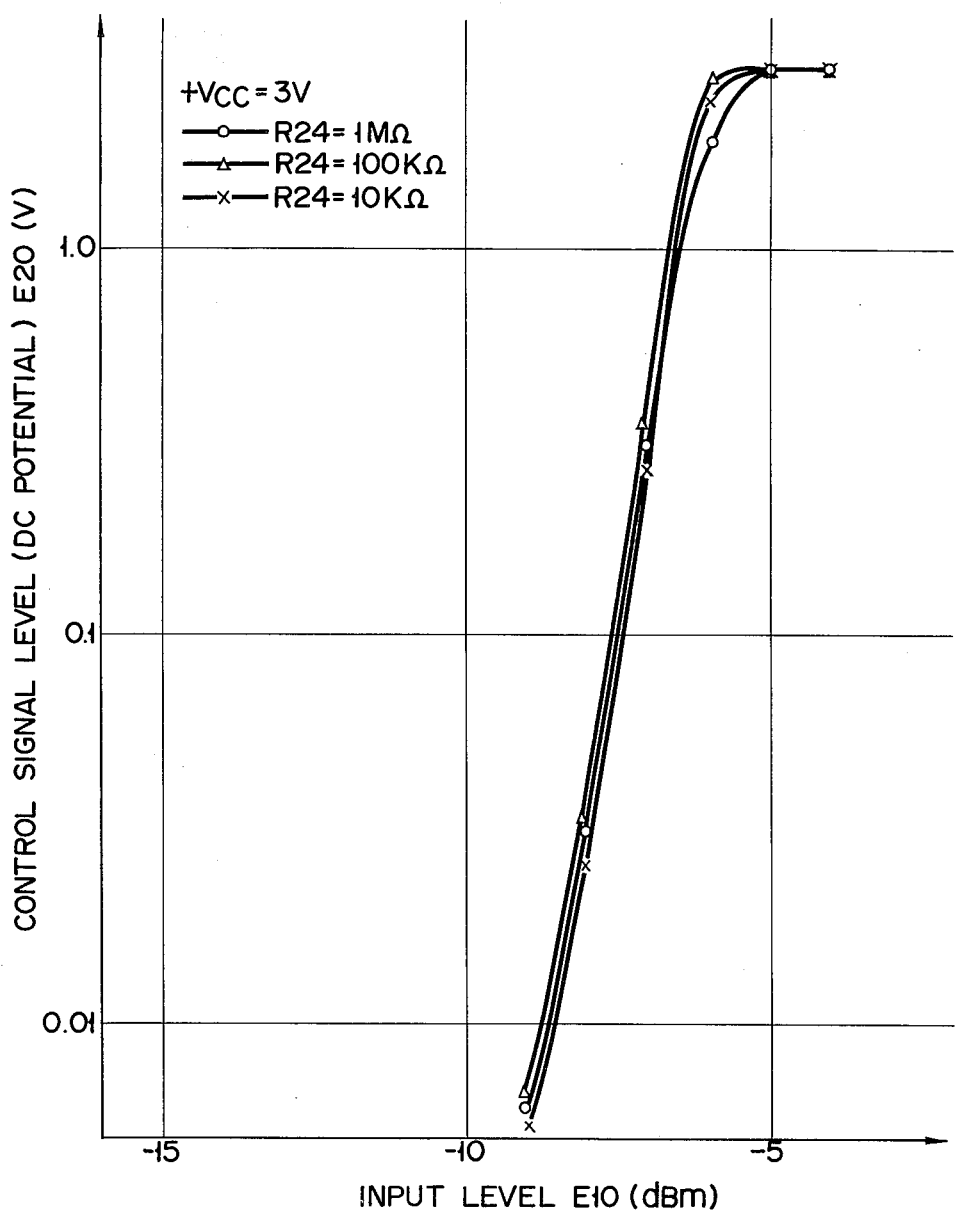

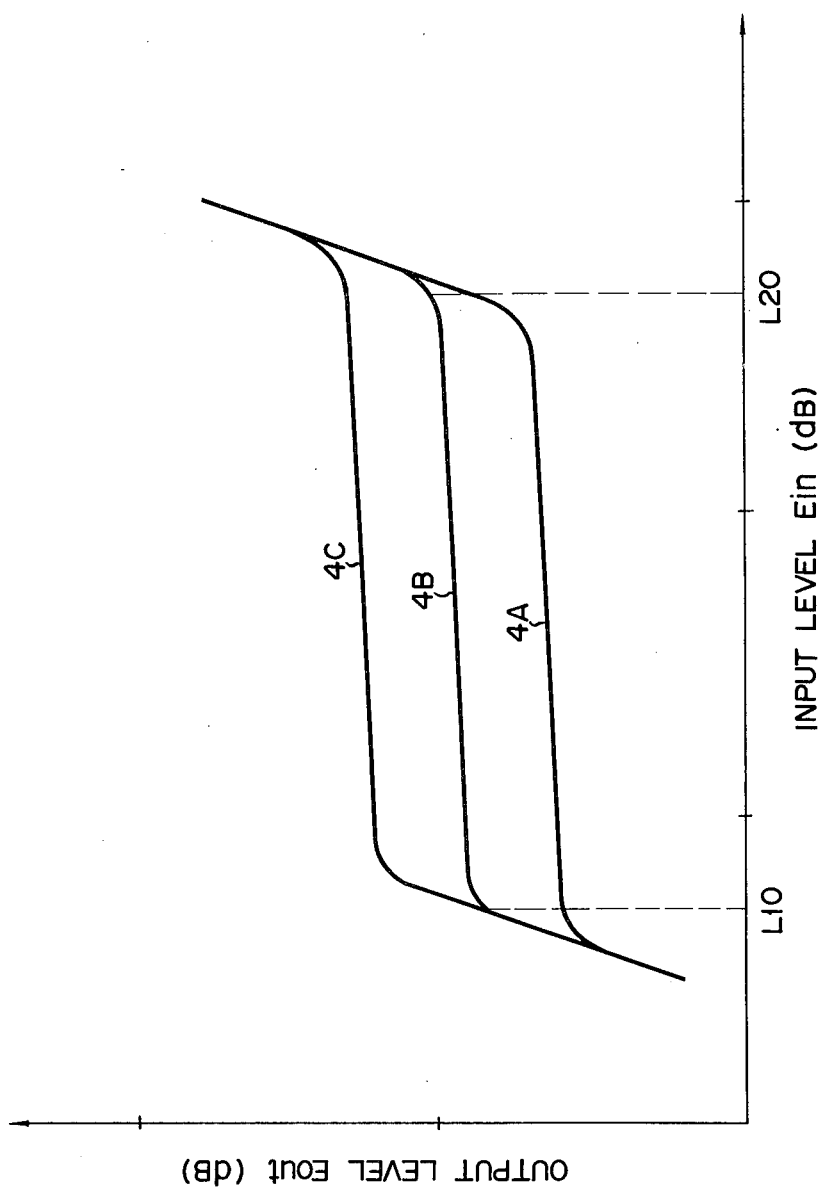

AUTOMATIC SIGNAL LEVEL CONTROL DEVICE

BACKGROUND OF THE INVENTION

This invention relates to a device for automatically controlling the level of an analog signal.

A device for automatically controlling the level of an analog signal is broadly classified into two types: dynamic level compressor (DLC) and dynamic level expander (DLE). Both types are included in an automatic level control device in the broad sense. These types DLC, DLE are widely used with a noise reduction system, etc. Particularly, the DLC type is often used with a tape recorder. The DLC for a tape recorder is generally referred to as an automatic level controller (ALC), and is used to record sounds with a proper signal level, regardless of the magnitude of the level of a recording input signal.

FIG. 1 shows the basic arrangement of the above-mentioned automatic level-controlling device. An input signal Ein is supplied from an input terminal A to a variable gain circuit 10. At this time, a first signal E10 corresponding to the input signal Ein is delivered from the variable gain circuit 10 to a detector 20, which in turn sends forth a second signal E20 having a DC level corresponding to the magnitude of the first signal E10. The second signal E20 is supplied as a control signal to a variable impedance element 30, which is connected to the variable gain circuit 10 through a connection line LC. Where the arrangement of FIG. 1 constitutes the aforementioned automatic level controller ALC, then the average level of an output signal Eout from the variable gain circuit 10 is restricted within a certain prescribed range regardless of the magnitude of the level of an input signal Ein. An output signal Eout whose level has thus been automatically controlled is issued from an output terminal B.

Hitherto, the detector 20 is often formed of a diode or a circuit utilizing a rectifying action taking place across the base-emitter region of a transistor. The detector 20 has to produce a second signal E20 having a higher level than the input threshold level of the variable impedance element 30. The reason is that where the second signal E20 has a lower level than the input threshold level, then the automatic control of a signal level can not be effected. Therefore, the first signal E10 which corresponds to the second signal E20 having a higher level than said input threshold level has to be supplied to the detector 20. With the conventional voltage arrangement, it has been necessary to let the first signal E10 or output signal Eout have a sufficiently high level in order to meet the above-mentioned requirement. This requirement has rendered the conventional circuit unadapted to be used with a device operated at a low voltage level of the order of 2 to 3 volts. The reason why a low signal level and a low power supply voltage are not suitable for the conventional circuit is discussed in the U.S. patent application "Automatic Level Control Device", U.S. Ser. No. 275,347, filed on June 19, 1981, inventor: Kenji FUJIBAYASHI. The disclosure of the above U.S. application is now combined herewith.

SUMMARY OF THE INVENTION

This invention has been accomplished in view of the above-mentioned circumstances and is intended to provide an automatic signal level control device which can carry out a stable operation with respect to even a low power supply voltage or low signal level.

To attain the above-mentioned object, this invention provides an automatic signal level control device equipped with a specially arranged detector which comprises a transistor whose base is supplied with an output signal from the signal level control device, a capacitor connected to the emitter of the transistor, and a feedback element coupled between the emitter and base of the transistor.

According to the above-mentioned arrangement, the charged voltage component of the capacitor is positively fed back to the base side of the transistor by means of the feedback element. An output signal from the signal level control device is superposed on the positively fed back component. Therefore, a high level control signal can be easily generated, even where an output signal from the signal level control device has a low level. The above-mentioned positive feedback operation enables a control signal having a relatively high level to be generated, even where a power supply voltage drops to the proximity of the lowest limit at which the transistor can be operated.

BRIEF DESCRIPTION OF THE DRAWINGS

FIG. 3A graphically shows the input-output characteristic of the detector 20 determined in the absence of the diode D24 with the value of the feedback resistor R24 used as a parameter;

FIG. 4 graphically indicates the input-output characteristic of the variable gain circuit 10 of FIG. 2 with the value of the feedback resistor R24 used as a parameter;

DETAILED DESCRIPTION OF THE PREFERRED EMBODIMENTS

Figure 1:
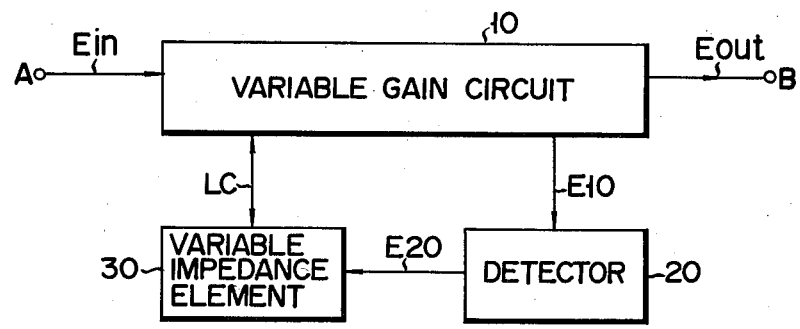
FIG. 1 is a block circuit diagram showing the fundamental arrangement of an automatic signal level control device.

Description is now given with reference to the accompanying drawings of an automatic signal level control device embodying this invention. Throughout the drawings, the same parts are denoted by the same reference numerals, duplicated description thereof being omitted.

Figure 2:
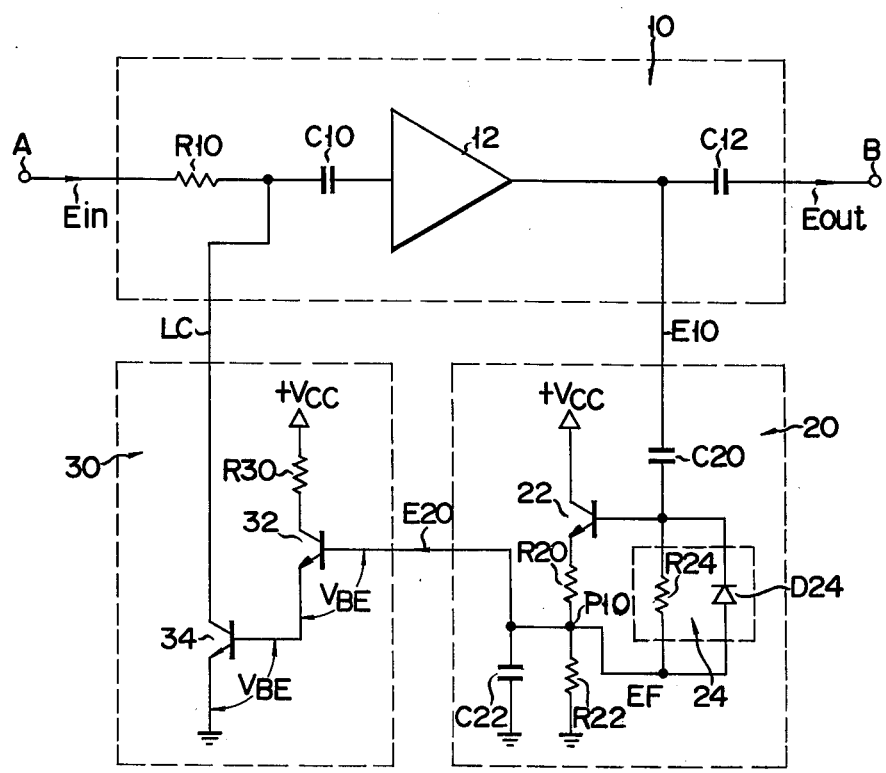
FIG. 2 illustrates a circuit arrangement of an automatic signal level control device embodying this invention.

Referring to FIG. 2, the input terminal A of the signal level control device is connected to the input terminal of an amplifier 12 through an input resistor R10 and an input capacitor C10. The output terminal of the amplifier 12 is connected via an ouput capacitor C12 to the output terminal B of the signal level control device. A first signal E10 is drawn out from the output terminal of the amplifier 12. The first signal E10 is supplied to the base of an NPN transistor 22 through a coupling capacitor C20. The collector of the transistor 22 is connected to a positive power source +Vcc. The emitter of the transistor 22 is grounded through a first resistor (charge resistor) R20 and a charge-storing capacitor C22. A junction P10 of the first resistor R20 and the charge-storing capacitor C22 is grounded through a second resistor (discharge resistor) R22. Issued from the junction P10 is a feedback signal EF corresponding to the charged potential of the capacitor C22. The feedback signal EF is fed back to the base of the transistor 22 through a region defined between the anode and cathode of the feedback diode D24. A feedback resistor R24 is connected in parallel to the feedback diode D24. The feedback diode D24 and feedback resistor R24 jointly constitute a feedback element 24 connected between the base and emitter of the transistor 22. It will be noted that as later described with reference to FIG. 3A, the signal level control device of this invention can be effectively operated without applying the feedback diode D24.

The first resistor R20 is connected in series to a path of charge current which flows from the positive power source +Vcc to the charge-storing capacitor C22 through the collector-emitter path of the transistor 22 when it is rendered conducting. The value of the first resistor R20 is included in the charge time constant of the charge-storing capacitor C22. The value of the second resistor R22 is included in the discharge time constant of the charge-storing capacitor C22. The first resistor R20 can regulate the attack time of the automatic level controller ALC. The second resistor R22 can regulate the recovery time of the level controller ALC. The coupling capacitor C20 is provided to effect the DC blocking of the base of the transistor 22 from the output circuit of the amplifier 12. Without the coupling capacitor C20, the transistor 22 is always rendered conducting or nonconducting, in case the DC potential of the output terminal of the amplifier 12 is noticeably displaced from the zero level, thereby giving rise to the failure of the automatic level control. Further without the coupling capacitor C20, the DC or very low frequency AC positive feedback from the junction P10 to the base of the transistor 22 is little effected, where the amplifier 12 has a small DC output resistance.

The value of the first resistor R20 may be zero in order to shorten the attack time of the automatic level control (ALC). Where the input resistance of the variable impedance element 30 is small or the recovery time of the automatic level control (ALC) is to be extended, then the value of the second resistor R22 may be rendered indefinite. Generally, the first resistor R20 is chosen to have a resistance of scores of or hundreds of ohms, and the second resistor R22 is chosen to have a resistance of hundreds of or thousands of kiloohms.

Issued from the junction P10 is a second signal E20 whose potential corresponds to that of the first signal E10. The second signal E20 is supplied to the base of an NPN transistor 32, whose collector is connected to the positive power source +Vcc through a resistor R30, and whose emitter is connected to the base of an NPN transistor 34. The emitter of the transistor 34 is grounded, and the collector thereof is connected to the junction of the input resistor R10 and input capacitor C10. Where the second signal E20 has a higher potential than a sum $2V_{BE}$ of the input threshold levels of the transistors 32 and 34, then a base current runs through the transistor 34. The internal impedance of the collector-emitter region of the transistor 34 varies with the base current of the transistor 34. The input resistor R10 and the internal impedance of the transistor 34 jointly constitute an attenuator provided on the input side of the variable gain amplifier 10. The extent to which the attenuator attenuates the input signal Ein varies with the level of the second signal E20, which controls the variable impedance element 30. The sum $2V_{BE}$ of the input threshold levels of the transistors 32 and 34 constitutes the input threshold level of the variable impedance element 30. Where a silicon transistor is used, said sum $2V_{BE}$ has a value approximating 1 V at room temperature.

Where the transistor 22, when rendered conducting, has a very small base current, then the base potential of the transistor 22 is approximately equal to the potential of the junction P10. The potential of the junction P10 is positively fed back to the base of the transistor 22 without being considerably reduced by the feedback element 24. In the range where the transistor 22 carries out an unsaturated operation, said positive feedback causes the second signal E20 to noticeably vary with the first signal E10.

Figure 3:
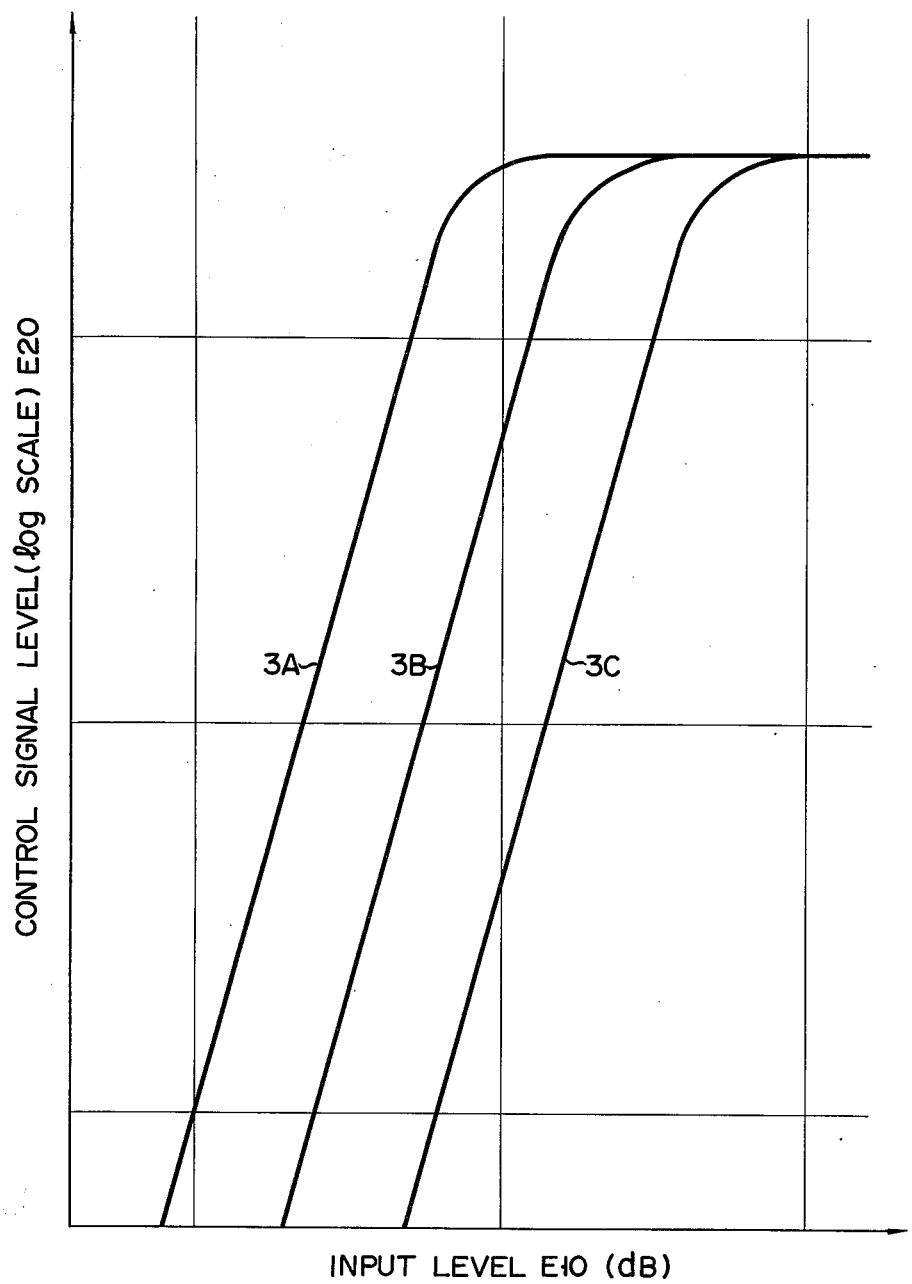
FIG. 3 graphically illustrates the input-output characteristic of the detector 20 determined with the value of the feedback resistor R24 of FIG. 2 used as a parameter.

FIG. 3 illustrates the input-output characteristic of the detector 20. The three curves 3A, 3B, 3C indicate relationships between the first signal E10 and second signal (control signal) E20. The curve 3A shows that the feedback resistor R24 has a sufficiently larger value than the case of the curve 3B, that is, R24= ∞. The curve 3C indicates that the resistor R24 has a much smaller value than the case of the curve 3B. These curves 3A, 3B and 3C are all sharply inclined (i.e. dE20/dE10 is large), namely indicate that the detector 20 has a large transfer function of E20/E10. Since, therefore, the automatic level control (ALC) loop has an increased gain, the level of the output signal Eout varies to a smaller extent.

FIG. 3A illustrates another input-output characteristic of the detector 20. This characteristic was determined by the experiment which was conducted under the following condition in the absence of the diode D24.
Power source voltage +Vcc=3 V
Transistor 22=2SC 1623
Capacitor C20=0.1 μF
Capacitor C22=33 μF
Resistor R20=100 Ω
Resistor R22=1 MΩ
Resistor R24=10 KΩ, 100 KΩ and 1 MΩ
The parameter of the three curves is R24. FIG. 3A shows that all the curves have sharp inclinations (dE20/dE10) and little vary by the parameter R24. In other words, the detector 20 has a large transfer function (E20/E10), which, however, little depends on the value of the parameter R24. FIG. 3A differs from FIG. 3 in the above-mentioned respect. Namely, where the diode D24 is provided, it is possible to let the magnitude of the transfer function E20/E10 vary with the value of the resistor R24 without changing the inclination of the input signal E10 vs. the output signal E20. In the absence of the diode D24, the automatic level control loop (ALC loop) can retain a high loop gain regardless of the value of the resistor R24. Thus, in the range where the transistor 22 carries out an unsaturated operation, the level of the output signal Eout can be made to vary little with the input signal Ein even in the absence of the diode D24.

FIG. 4 indicates the input-output characteristic of the variable gain circuit 10. The three curves 4A, 4B and 4C respectively correspond to the three curves 3A, 3B and 3C of FIG. 3. Referring to curve 4B, the transistor 34 is not rendered conducting when the level of an input signal Ein is lower than L10. Where the level of an input signal Ein rises above L20, then the transistor 34 is saturated. Therefore, the range of the input signal level where ALC can be operated extends from L10 to L20. With the circuit arrangement of FIG. 2, the level variation of an output signal Eout which is accompanied by the input level variation of 30 dB or more can be restricted within a value approximately 1 dB.

FIG. 3 shows that a minimum level of an input signal required to provide an input threshold level of $2V_{BE}$ for the variable impedance element 30 can be varied the feedback resistor R24 due to the presence of the diode D24. FIG. 4 indicates that a prescribed level of output signals converged by the ALC operation (the horizontal portions of curves 4A to 4C) can be varied by the feedback resistor R24. Namely, where the feedback resistor R24 is variable resistor, the starting level of the ALC circuit and the level of an output signal therefrom can be varied without modifying any other part of the ALC circuit. Even where, therefore, the arrangements of the variable gain circuit 10 and the variable impedance element 30 are changed with the arrangement of the detector 20 fixed, it is possible to let the ALC circuit have the desired characteristics with respect to the starting level and other factors simply by changing the value of only the feedback resistor R24. Consequently, this invention enables the ALC circuit to be designed with a greater latitude. This fact can be regarded as the prominent feature of the detector 20 of the automatic signal level control device of this invention, which has been impossible with the conventional type.

Figure 5:
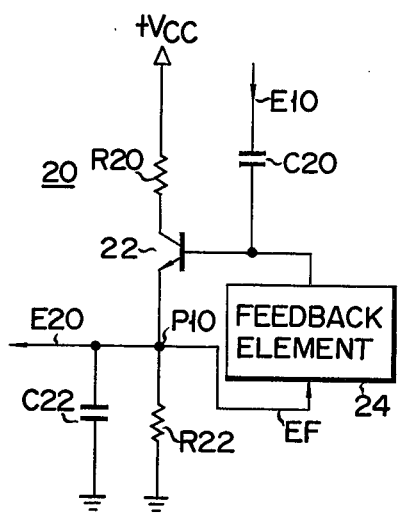
FIGS. 5 and 6 are the modified circuit arrangements of the detector 20 of FIG. 2.
Figure 6:
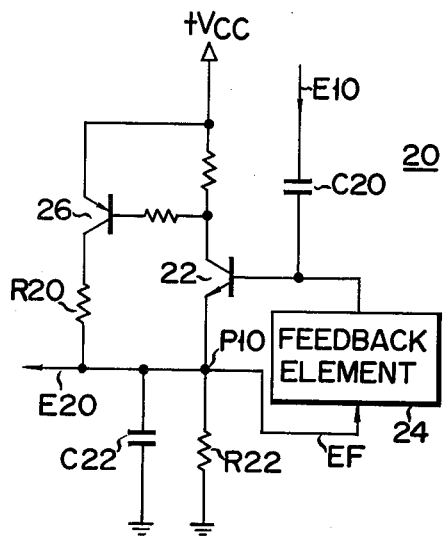

Description is now given with reference to FIGS. 5 and 6 each of which shows the modification of the arrangement of the above-mentioned detector 20. Referring to FIG. 5, the first resistor (charge resistor) R20 is set on the corrector side of the transistor 22. Where the transistor 22 is rendered conducting, then the collector-emitter region thereof is substantially brought to a short-circuited state. Therefore, the resistor R20 need not be set on the emitter side of the transistor 22. The point is that the resistor R20 be connected in series to the charge current path of the charge-storing capacitor C22. Referring to FIG. 6, a transistor circuit for charging the capacitor C22 is formed of an inverted Darlington circuit. In this case, the charge current of the capacitor C22 is supplied chiefly through a PNP transistor 26. The transfer function E20/E10 of FIG. 6 is made larger than that of the detector 20 of FIGS. 2 or 5.

Figure 7:
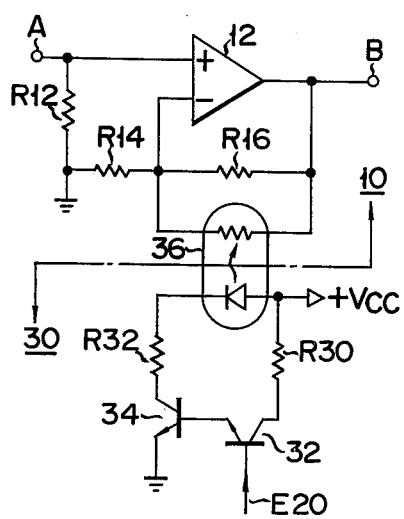
FIGS. 7 and 8 are the modified circuit arrangements of the variable impedance element 30 of FIG. 2.
Figure 8:
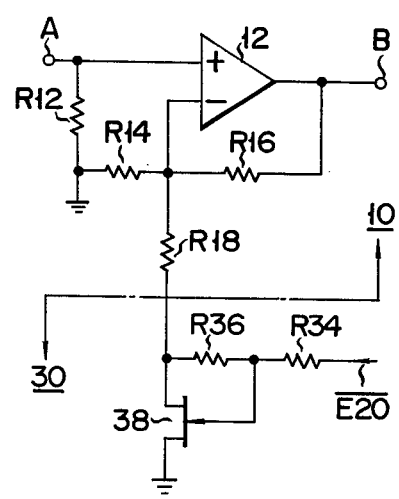

Description is now given with respect to FIGS. 7 and 8 each of which shows the modification of the arrangement of the aforementioned variable impedance element 30. Referring to FIG. 7, the ALC operation is effected by changing the feedback amount of the amplifier 12 by means of a photocoupler 36. Referring to FIG. 8, the feedback amount of the amplifier 12 is changed by means of the drain-source resistance of a field effect transistor (FET) 38. The gate of the FET 38 is supplied with a control signal E20 having the opposite phase to the second signal E20 via a resistor R34 (it will be noted that the supply of the second signal E20 provides a level expander instead of the ALC circuit). The gate of the FET 38 is connected to the drain thereof through a resistor R36. The source of the FET 38 is grounded, and the drain thereof is connected to the inverted input terminal of the amplifier 12 through a resistor R18. Since the amount of a feedback varies with the internal resistance of the FET 38, the ALC operation is enabled. A negative feedback is applied to the FET 38 by means of the resistors R34 and R36. This negative feedback improves the nonlinear property of the internal resistance of the FET 38, thereby providing an ALC circuit with little harmonic distortions.

Figure 9:
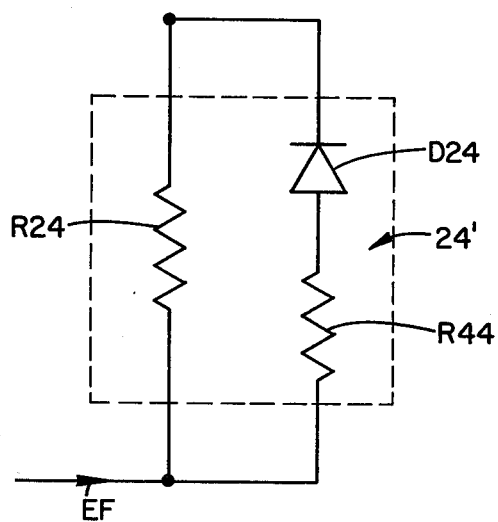
FIG. 9 shows a modified feedback element.

As shown in FIG. 9, which shows only a modified feedback element 24' which may be coupled in the circuit of FIG. 2 in place of feedback element 24, a second feedback resistor R44 may be connected in series with the diode D24. The input-output characteristics of FIGS. 3 and 4 vary with the value of a resistor connected in series or parallel with the diode D24.

It will be noted that this invention is not limited to the foregoing embodiments, but can be practiced with various modifications, changes and additions without departing from the invention. For instance, the diode D24 may be replaced by the base-emitter region of a transistor. It may be contemplated to supply a certain amount of DC bias current to the base of the transistor 22 through a high resistance resistor. As naturally expected, this invention is also applicable to a volume or level expander.

What is claimed is:

1. An automatic signal level control device comprising:
    a variable impedance element having an impedance which is varied as a function of the level of control signal applied thereto;
    a variable gain control coupled to said variable impedance element and providing an output signal with a gain which is varied as a function of the impedance of said variable impedance element; and
    detector means coupled to said variable impedance element and to said variable gain circuit, for generating said control signal upon receipt of the output signal from said variable gain circuit;
    said detector means comprising:
    a transistor having a base which is supplied with a first signal which is a function of the output signal from said variable gain circuit and an emitter from which there is drawn out a second signal having a potential which is a function of that of said first signal;
    a feedback element coupled between the base and emitter of said transistor, said feedback element including a feedback resistor; and
    a capacitor coupled between the emitter of said transistor and a circuit having substantially no AC potential, for storing a charge corresponding to said second signal, a feedback signal corresponding to the charged potential of said capacitor being fed back to the base of said transistor through said feedback element, and wherein said second signal corresponds to said control signal.

2. An automatic signal level control device comprising:
    a variable impedance element having a impedance which is varied as a function of the level of control signal applied thereto;
    a variable gain circuit coupled to said variable impedance element and providing an output signal with a gain which is varied as a function of the impedance of said variable impedance element; and
    detector means coupled to said variable impedance element and to said variable gain circuit, for generating said control signal upon receipt of the output signal from said variable gain circuit;
    said detector means comprising:
    a bipolar transistor having a base which is supplied with a first signal which is a function of the output signal from said variable gain circuit and an emitter from which there is drawn out a second signal having a potential which is a function of that of said first signal;
a feedback element coupled between the base and emitter of said transistor, said feedback element including:
a PN junction type diode, the base-emitter PN junction of said bipolar transistor being coupled in parallel with the PN junction of said PN junction type diode such that the PN junctions of said bipolar transistor and of said diode are coupled in mutually opposite directions; and
a feedback resistor coupled in parallel with said base-emitter PN junction of said bipolar transistor; and
a capacitor coupled between the emitter of said transistor and a circuit having substantially no AC potential, for storing a charge corresponding to said second signal, a beedback signal corresponding to the charged potential of said capacitor being fed back to the base of said transistor through said feedback element, and wherein said second signal corresponds to said control signal.

3. A device of claim 1 or 2, wherein said detector means comprises a charge resistor connected in series with the path of a charge current conducted to said capacitor through the collector-emitter path of said transistor; and the value of said charge resistor is included in the charge time constant of said capacitor.

4. A device of claim 1 or 2, wherein said detector means comprises a first resistor connected in series between the emitter of said transistor and said capacitor and a second resistor connected in parallel between the emitter of said transistor and said circuit having substantially no AC potential, the value of said first resistor being included in the charge time constant of said capacitor, and the value of said second resistor being included in the discharge time constant of said capacitor.

5. A device of claim 1 or 2, wherein said detector means comprises a second capacitor connected in series between the output circuit of said variable gain circuit and the base of said transistor, only the AC component of said output signal being supplied to the base of said transistor through said second capacitor.

6. A device of claim 1 or 2, wherein said variable impedance element comprises an attenuator set on the input side of said variable gain circuit, an output signal from said attenuator being attenuated in accordance with variations in the level of said control signal.

7. A device of claim 1 or 2, wherein said variable gain circuit includes a feedback loop, the variable impedance element being included in said feedback loop, and the closed loop gain of said variable gain circuit varying with the level of said control signal.

8. A device of claim 1 or 2, wherein said detector means comprises a second feedback resistor connected in series with said diode.

9. A device of claim 3, wherein said detector means comprises a first resistor connected in series between the emitter of said transistor and said capacitor and a second resistor connected in parallel between the emitter of said transistor and said circuit having substantially no AC potential, the value of said first resistor being included in the charge time constant of said capacitor, and the value of said second resistor being included in the discharge time constant of said capacitor.

10. A device of claim 3, wherein said detector means comprises a second capacitor connected in series between the output circuit of said variable gain circuit and the base of said transistor, only the AC component of said output signal being supplied to the base of said transistor through said second capacitor.

11. A device of claim 4, wherein said detector means comprises a second capacitor connected in series between the output circuit of said variable gain circuit and the base of said transistor, only the AC component of said output signal being supplied to the base of said transistor through said second capacitor.

12. A device of claim 3, wherein said variable impedance element comprises an attenuator set on the input side of said variable gain circuit, an output signal from said attenuator being attenuated in accordance with variations in the level of said control signal.

13. A device of claim 4, wherein said variable impedance element comprises an attenuator set on the input side of said variable gain circuit, an output signal from said attenuator being attenuated in accordance with variations in the level of said control signal.

14. A device of claim 5, wherein said variable impedance element comprises an attenuator set on the input side of said variable gain circuit, an output signal from said attenuator being attenuated in accordance with variations in the level of said control signal.

15. A device of claim 3, wherein said variable gain circuit includes a feedback loop, the variable impedance element being included in said feedback loop, and the closed loop gain of said variable gain circuit varying with the level of said control signal.

16. A device of claim 4, wherein said variable gain circuit includes a feedback loop, the variable impedance element being included in said feedback loop, and the closed loop gain of said variable gain circuit varying with the level of said control signal.

17. A device of claim 5, wherein said variable gain circuit includes a feedback loop, the variable impedance element being included in said feedback loop, and the closed loop gain of said variable gain circuit varying with the level of said control signal.

18. A device of claim 3, wherein said detector means comprises a second feedback resistor connected in series with said diode.

19. A device of claim 4, wherein said detector means comprises a second feedback resistor connected in series with said diode.

20. A device of claim 5, wherein said detector means comprises a second feedback resistor connected in series with said diode.

21. A device of claim 6, wherein said detector means comprises a second feedback resistor connected in series with said diode.

22. A device of claim 7, wherein said detector means comprises a second feedback resistor connected in series with said diode.

* * * * *